(12) United States Patent
Chio et al.

(10) Patent No.: US 10,734,442 B2
(45) Date of Patent: Aug. 4, 2020

(54) OPTOELECTRONIC DEVICE WITH LIGHT-EMITTING DIODES

(71) Applicant: Aledia, Grenoble (FR)

(72) Inventors: Zheng-Sung Chio, Melaka (MY); Wei Sin Tan, Meylan (FR); Vincent Beix, Fontaine (FR); Philippe Gilet, Teche (FR); Pierre Tchoulfian, Grenoble (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 16/473,551

(22) PCT Filed: Dec. 28, 2017

(86) PCT No.: PCT/EP2017/084778
§ 371 (c)(1),
(2) Date: Jun. 25, 2019

(87) PCT Pub. No.: WO2018/122355
PCT Pub. Date: Jul. 5, 2018

(65) Prior Publication Data
US 2019/0333963 A1  Oct. 31, 2019

(30) Foreign Application Priority Data
Dec. 29, 2016  (FR) ..................................... 16 63508

(51) Int. Cl.
*H01L 27/15* (2006.01)
*H01L 33/24* (2010.01)
(Continued)

(52) U.S. Cl.
CPC ............ *H01L 27/156* (2013.01); *H01L 33/24* (2013.01); *H01L 33/46* (2013.01); *H01L 33/508* (2013.01); *H01L 2933/0033* (2013.01)

(58) Field of Classification Search
CPC .. H01L 27/156; H01L 21/7622; H01S 5/4025
See application file for complete search history.

(56) References Cited

U.S. PATENT DOCUMENTS

| | | |
|---|---|---|
| 9,106,056 B1 | 8/2015 | Hersee |
| 2011/0096134 A1 | 4/2011 | Kang et al. |
| 2015/0124076 A1* | 5/2015 | Hersee ................. G02B 21/002 |
| | | 348/79 |

FOREIGN PATENT DOCUMENTS

| | | |
|---|---|---|
| WO | WO 2015/063077 A1 | 5/2015 |
| WO | WO 2016/108021 A1 | 7/2016 |

OTHER PUBLICATIONS

International Preliminary Report on Patentability for International Application No. PCT/EP2017/084778, dated Jul. 11, 2019.
(Continued)

*Primary Examiner* — Thomas L Dickey
(74) *Attorney, Agent, or Firm* — Wolf, Greenfield & Sacks, P.C.

(57) ABSTRACT

A method of manufacturing an optoelectronic device, comprising the successive steps of: a) providing a substrate at least partially made of a semiconductor material and having first and second opposite faces; b) forming light-emitting diodes on the substrate, each light-emitting diode comprising a semiconductor microwire or nanowire covered by a shell; c) forming an encapsulation layer surrounding the light-emitting diodes; d) forming conductive pads on the encapsulation layer, on the side of the encapsulation layer opposite to the substrate, in contact with the light-emitting diodes; and e) forming through openings in the substrate from the side of the second face, said openings being opposite at least part of the light-emitting diodes and delimiting walls in the substrate.

20 Claims, 9 Drawing Sheets

(51) Int. Cl.
*H01L 33/46* (2010.01)
*H01L 33/50* (2010.01)

(56) References Cited

OTHER PUBLICATIONS

International Search Report and Written Opinion for International Application No. PCT/EP2017/084778, dated Feb. 12, 2018.

* cited by examiner

OPTOELECTRONIC DEVICE WITH LIGHT-EMITTING DIODES

This application is a national stage filing under 35 U.S.C. § 371 of International Patent Application Serial No. PCT/EP2017/084778, filed Dec. 28, 2017, which claims priority to French patent application FR16/63508, filed Dec. 29, 2016, The entire contents of these applications are incorporated herein by reference in their entireties.

BACKGROUND

The present disclosure relates to an optoelectronic device, particularly a display screen or an image projection device, with light-emitting diodes based on semiconductor materials and their manufacturing methods.

DISCUSSION OF THE RELATED ART

A pixel of an image corresponds to the unit element of the image displayed by the optoelectronic device. When the optoelectronic device is a color image display optoelectronic device, it generally comprises for the display of each pixel of the image at least three components, also called display sub-pixels, which each emit a light radiation substantially in a single color (for example, red, green, and blue). The superposing of the radiations emitted by the three display sub-pixels provides the observer with the color sensation corresponding to the pixel of the displayed image. In this case, the assembly formed by the three display sub-pixels used to display a pixel of an image is called display pixel of the optoelectronic device.

There exist optoelectronic devices comprising light-emitting diodes having micrometer-range or nanometer-range semiconductor elements, especially semiconductor microwires or nanowires, for example made of at least one group-III element and one group-V element, called III-V compound hereafter, particularly gallium nitride (GaN).

Optoelectronic devices may comprise blocks of photoluminescent materials formed on the light-emitting diodes. Each block is adapted to convert the radiation emitted by the light-emitting diodes into a desired radiation. The blocks are located on the light-emitting diodes according to the sub-pixel arrangement.

In an image display device, crosstalk occurs when the light emitted by the light-emitting diode associated with one subpixel reaches the photoluminescent block associated with another subpixel. In order to reduce cross-talk between subpixels and increase contrast, it is known to provide opaque or reflecting walls between the photoluminescent blocks. The walls can be made by electroplating techniques. However, these techniques do not generally allow to form walls with an aspect ratio that is adapted to the dimensions of the subpixels and the photoluminescent blocks, in particular for subpixels having a lateral dimension inferior to 15 µm. It is desirable to have tall and thin walls. The standard technology allows to have either tall and thick wall or thin but small wall. In particular, it is desired to have an aspect ratio as high as possible, and preferably higher than 5. It also is desired to decrease the space taken by the walls.

There exist some manufacturing methods of optoelectronic devices that comprise the formation of trenches in a substrate to delimit the subpixels. However, it is difficult to have a high density of trenches to obtain a fine pitch in particular for subpixels having a lateral dimension inferior to 15 µm.

There also exist some manufacturing methods of optoelectronic devices that comprise the complete or partial withdrawal of the substrate on which the light-emitting diodes are formed. However, there may be a risk of formation of cracks during the removal of the substrate and the formation of walls.

SUMMARY

An object of an embodiment aims at overcoming all or part of the disadvantages of the previously-described optoelectronic devices comprising light-emitting diodes having micrometer-range or nanometer-range semiconductor elements, arranged to form display subpixels.

Another object of an embodiment is that crosstalk between adjacent subpixels is reduced.

Another object of an embodiment is that contrast is increased.

Another object of an embodiment is that the optoelectronic device comprise subpixels having a lateral dimension inferior to 15 µm.

Thus, an embodiment provides a method of manufacturing an optoelectronic device, comprising the successive steps of:

a) providing a substrate at least partially made of a semiconductor material and having first and second opposite faces;

b) forming light-emitting diodes on the substrate, each light-emitting diode comprising a semiconductor microwire or nanowire covered by a shell;

c) forming an encapsulation layer surrounding the light-emitting diodes;

d) forming conductive pads on the encapsulation layer, on the side of the encapsulation layer opposite to the substrate, in contact with the light-emitting diodes; and e) forming through openings in the substrate from the side of the second face, said openings being opposite at least part of the light-emitting diodes and delimiting walls in the substrate.

According to an embodiment, the method further comprises the step of:

f) forming photoluminescent blocks in at least some of the openings.

According to an embodiment, step b) comprises forming a seed layer in contact with the substrate, the seed layer being made of a material favoring the growth of the semiconductor microwire or nanowire, and growing the wires on the seed layer.

According to an embodiment, the seed layer may be at least partially made of aluminum nitride, of boron, of boron nitride, of titanium, or titanium nitride, of tantalum, of tantalum nitride, of hafnium, of hafnium nitride, of niobium, of niobium nitride, of zirconium, of zirconium borate, of zirconium nitride, of silicon carbide, of tantalum nitride and carbide, of magnesium nitride in $Mg_xN_y$ form, where x is equal to 3 to within 10% and y is equal to 2 to within 10%, of magnesium gallium nitride, of tungsten, of tungsten nitride, or of a combination thereof.

According to an embodiment, the method further comprises, before step e), the step of thinning down the substrate.

According to an embodiment, the method further comprises, before step e), the step of bonding the encapsulation layer to an electronic circuit or a holder.

According to an embodiment, the method further comprises, before step d), the step of etching trenches in the encapsulation layer between the light-emitting diodes and covering each trench with a reflective coating, at least partially filling each trench with a filling material and/or letting air or a partial void in each trench.

According to an embodiment, at step d), the conductive pads are formed in contact with the shells.

According to an embodiment, the method further comprises, before step d), the step of etching portions of the shells to expose the ends of the semiconductor microwires or nanowires, the conductive pads, at step d) being formed in contact with the semiconductor microwires or nanowires and being electrically insulated from the shells.

According to an embodiment, each semiconductor microwire or nanowire comprises lateral faces and a top face opposite to substrate and, for each light-emitting diode, the shell covers the lateral faces and the top face of the microwire or nanowire.

According to an embodiment, each semiconductor microwire or nanowire comprises lateral faces and a top face opposite to substrate and, for each light-emitting diode, the shell covers only the top face of the microwire or nanowire.

Another embodiment provides an optoelectronic device comprising:

light-emitting diodes, each light-emitting diode comprising a semiconductor microwire or nanowire covered by a shell, the light-emitting diodes being surrounded by an encapsulation layer;

walls at least partially made of a semiconductor material resting on the encapsulation layer, said walls delimiting openings, said openings being opposite at least part of the light-emitting diodes; and conductive pads, on the side of the encapsulation layer opposite to the walls, in contact with the light-emitting diodes.

According to an embodiment, the optoelectronic device further comprises photoluminescent blocks in at least some of the openings.

According to an embodiment, the optoelectronic device further comprises, between the walls and the encapsulation layer, a seed layer in contact with the walls, the seed layer being made of a material favoring the growth of the semiconductor microwires or nanowires.

According to an embodiment, the seed layer may be at least partially made of aluminum nitride, of boron, of boron nitride, of titanium, or titanium nitride, of tantalum, of tantalum nitride, of hafnium, of hafnium nitride, of niobium, of niobium nitride, of zirconium, of zirconium borate, of zirconium nitride, of silicon carbide, of tantalum nitride and carbide, of magnesium nitride in $Mg_xN_y$ form, where x is equal to 3 to within 10% and y is equal to 2 to within 10%, of magnesium gallium nitride, of tungsten, of tungsten nitride, or of a combination thereof.

According to an embodiment, the optoelectronic device further comprises trenches extending in the encapsulation layer, each trench being at least covered with a reflective coating.

According to an embodiment, the conductive pads are in contact with the shells.

According to an embodiment, the conductive pads are in contact with the semiconductor microwire or nanowire and being electrically insulated from the shells.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
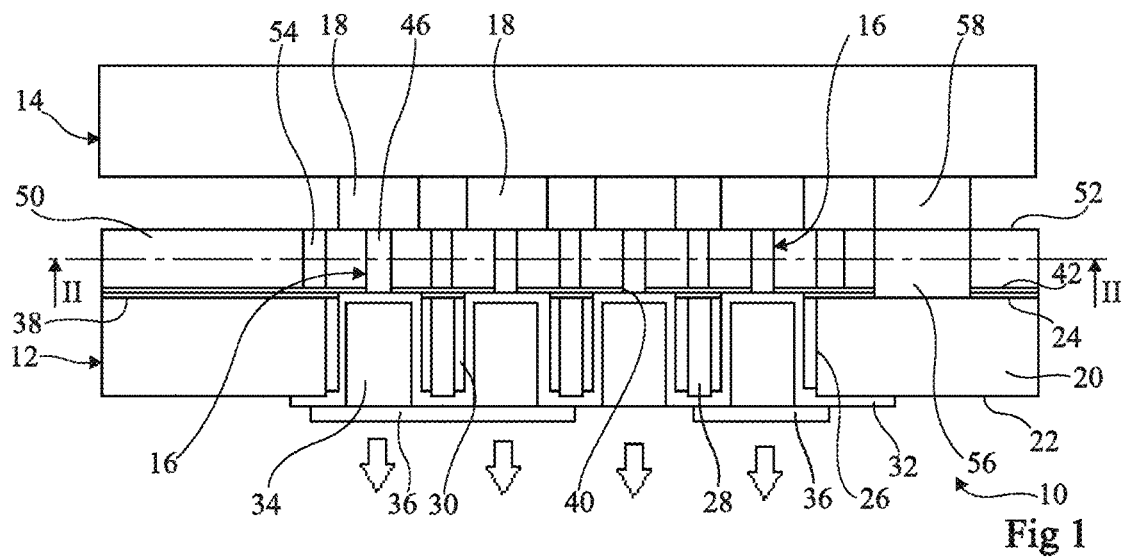
FIGS. 1 and 2 are simplified cross-section views of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing a light-emitting diode of an optoelectronic device are well known and will not be described.

In the following description, unless otherwise indicated, terms "substantially", "approximately", and "in the order of" mean "to within 10%". Moreover, "active area" of a light-emitting diode designates the region of the light-emitting diode from which most of the electromagnetic radiation provided by the light-emitting diode is emitted. Further, when a first element is said to be linked to a second element by an epitaxial relationship, this means that the first element is made from a first layer and the second element is made from a second layer that is grown by epitaxy on the first layer or inversely.

Further, term "particle" such as used in the context of the present disclosure should be understood in a broad sense and corresponds not only to compact particles more or less having a spherical shape but also to angular particles, to flattened particles, to flake-shaped particles, to fiber-shaped particles, or to fibrous particles, etc. It should be understood that the "size" of particles in the context of the present disclosure means the smallest transverse dimension of the particles. Particles of a material means the particles considered individually, that is, the unit elements of the material, knowing that the material may appear in the form of particle clusters. Phrase "average size" of particles means according to the present disclosure the arithmetic average of the particle sizes, that is, the sum of the particle sizes divided by the number of particles. The granulometry of the particles may be measured by laser granulometry by using, for example, a Malvern Mastersizer 2000.

The present description relates to optoelectronic devices comprising light-emitting diodes comprising semiconductor elements having micrometer-range or nanometer-range semiconductor elements, especially semiconductor microwires or nanowires.

Term "microwire" or "nanowire" designates a three-dimensional structure of elongated shape along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter. The base of the wire may have a cross section having a hexagonal, round or square shape according to the crystal structure of the wire.

In the following description, embodiments will be described in the case of an optoelectronic device with light-emitting diodes comprising semiconductor elements having the shape of microwires or nanowires with a constant cross-section. However, in all these embodiments, elements having the shape of microwires or nanowires may be replaced with elements having the shape of microwires or nanowires having a varying cross-section, for example microwires or nanowires having the shape of a cone or truncated cone.

Figure 2:
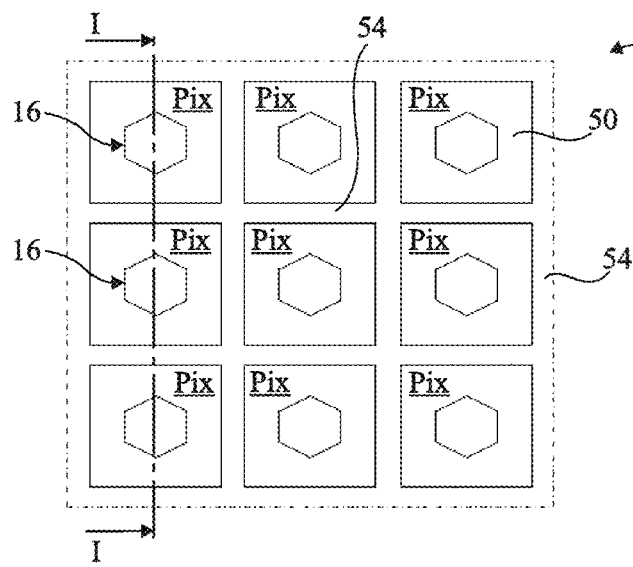
Figure 3:
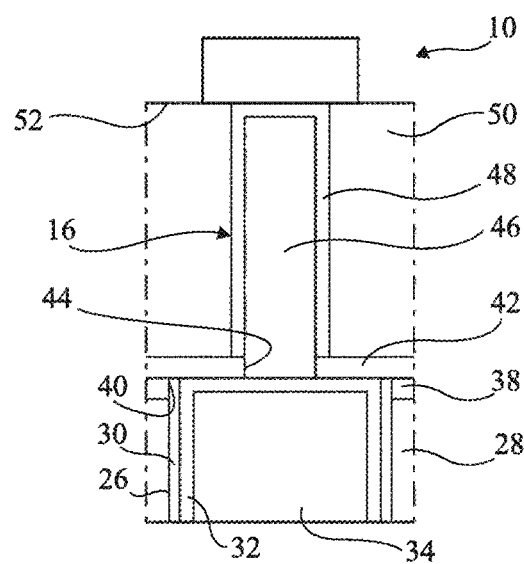
FIG. 3 is a more detailed cross-section view of a light-emitting diode of the optoelectronic device shown in FIG. 1.

FIGS. 1 and 2 show an embodiment of an optoelectronic device 10, for example corresponding to a display screen or to an image projection device. FIG. 3 is a more detailed view of a part of FIG. 1.

Device 10 comprises two integrated circuits 12, 14. First integrated circuit 12 comprises light-emitting diodes 16 and is called optoelectronic circuit or optoelectronic chip in the following description. Second integrated circuit 14 comprises electronic components, not shown, especially transistors, used to control the light-emitting diodes 16 of first integrated circuit 12. Second integrated circuit 14 is called control circuit or control chip in the following description. Optoelectronic circuit 12 is bonded to control circuit 14. According to the bonding type, bonding pads 18 may be present between optoelectronic chip 12 and control chip 14.

Optoelectronic circuit 12 comprises from bottom to top in FIG. 1:
a semiconductor substrate 20 comprising a lower surface 22 and an upper surface 24, upper surface 24 being preferably planar at least at the level of the light-emitting diodes 16;
openings 26 extending in substrate 20 from lower surface 22 to upper surface 24, parts of substrate 20 between adjacent openings 26 forming first walls 28;
a reflective or light-absorbing coating or a wave guide 30 covering the lateral faces of each opening 26;
an electrically conductive layer 32 covering coatings 30, the bottom of each opening 26 and also covering lower surface 22 at least between openings 26;
photoluminescent blocks 34 located in at least some of openings 26, other openings being possibly filled with a transparent material or filled with air;
filters 36 on lower surface 22 covering at least some of photoluminescent blocks 34;
seed layer 38 made of a material favoring the wire growth and arranged on upper surface 24 on walls 28, seed layer 38 comprising trough openings 40 for each photoluminescent block 34;
an insulating layer 42 covering seed layer 38 and photoluminescent blocks 34 and comprising openings 44;
wires 46, each wire 46 being in contact with conductive layer 32 through one of openings 44;
for each wire, a shell 48, shown only in FIG. 3, comprising a stack of semiconductor layers covering wire 46, the assembly formed by each wire 46 and the associated shell 48 forming light-emitting diode 16, shell 48 particularly comprising an active area, not shown, which is the layer from which most of the electromagnetic radiation supplied by light-emitting diode 16 is emitted;
an electrically insulating encapsulation layer 50 covering insulating layer 42, extending around light-emitting diodes 16 and delimiting an upper surface 52;
second reflective walls 54 extending through encapsulation layer 50 surrounding each light-emitting diode 16; and
an electrically conductive element 56, called via in the following description, extending through encapsulation layer 50 and in contact with substrate 20 on the side of surface 24.

In FIG. 1, it is shown only one wire 46 associated with each opening 26. In another embodiment, two wires 46 or more than two wires 46 may be associated with each opening 26, each wire 46 associated with the same opening 26 being in contact with conductive layer 32 at the bottom of said opening 26.

As it is shown in FIG. 2, in the present embodiment, walls 54 form a grid and light-emitting diodes 16 are arranged in rows and columns. As an example, nine subpixels Pix are shown in FIG. 2. Walls 28 may be aligned with walls 54 and also form a grid. In the present embodiment, openings 26 may have a square shape. However, the shape of openings 26 may be different. In another embodiment, each opening 26 may have a hexagonal shape, for example centered on the light-emitting diode 16.

Bonding pads 18 are located on surface 52 and are in contact with light-emitting diodes 16. According to an embodiment, one bonding pad 18 is provided for each subpixel Pix. A bounding pad 58 is located on surface 52 in contact with conductive via 56.

In operation, voltages are applied between pads 18 and pad 58, so that, for each subpixel Pix, light-emitting diode 16 of subpixel Pix emits light with an intensity that depends on the voltage applied between pad 58 and bounding pad 18 associated with subpixel Pix. Walls 28 and 54 reduce crosstalk between adjacent subpixels Pix. Crosstalk includes wavelength of visible light (such as blue light from light-emitting diode) and invisible light (such as ultra-violet from light-emitting diode), and light intensity (brightness)). In FIG. 1, only one pad 58 and only one via 56 are shown. In another embodiment, several pads 58 and several vias 56 may be provided.

Wires 46 are at least partly made of at least one semiconductor material. The semiconductor material may be silicon, germanium, silicon carbide, a III-V compound, a II-VI compound, or a combination of at least two of these compounds.

Wires 46 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 46 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Wires 46 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn)

The height of each wire 46 may be in the range from 250 nm to 50 µm. Each wire 46 may have an elongated semiconductor structure along an axis substantially perpendicular to surface 24. Each wire 46 may have a hexagonal cross-section. The axes of two adjacent wires 46 may be distant by from 0.3 µm to 10 µm and preferably from 1 µm to 5 µm. As an example, wires 46 may be regularly distributed, particularly in a hexagonal network.

In FIG. 3, shell 48 covers the lateral faces and the top face of wire 46. In another embodiment, shell 48 may be present only on top face of wire 46 opposite to substrate 20.

Shell 48 may comprise a stack of a plurality of layers especially comprising:

an active area covering at least part of wire 46;

an intermediate layer having a conductivity type opposite to wire 46 and covering the active layer; and a bonding layer covering the intermediate layer and in contact with pad 18.

Active area is the layer having most of the radiation supplied by light-emitting diode LED emitted therefrom. According to an example, the active area may comprise confinement means. Active area may comprise a single quantum well. It may then comprise a semiconductor material different from the semiconductor material forming wires 46 and intermediate layer and having a bandgap smaller than that of wires 46. Active area may comprise multiple quantum wells. It then comprises a stack of semiconductor layers forming an alternation of quantum wells and of barrier layers. It is for example formed of an alternation of GaN and InGaN layers, such a stack being generally called a heterostructure. The GaN and InGaN layers may have respective thicknesses from 3 nm to 20 nm (for example, 6 nm) and from 1 nm to 10 nm (for example, 2.5 nm). The GaN layers may be doped, for example, of type N or P. According to another example, the active layer may comprise a single InGaN layer, for example having a thickness greater than 10 nm. Preferably the layers of active area are linked to wire 46 by an epitaxial relationship.

The intermediate layer, for example, P-type doped, may correspond to a semiconductor layer or to a stack of semiconductor layers and enables to form a P-N or P-I-N junction, the active layer being between the intermediate P-type layer and wire 46 of the P-N or P-I-N junction.

The bonding layer may correspond to a semiconductor layer or to a stack of semiconductor layers and enables to form an ohmic contact between the intermediate layer and pad 18. As an example, the bonding layer may be very heavily doped with the type opposite to the lower portion of wire 46, to degenerate the semiconductor layers, for example, P-type doped with a concentration greater than or equal to $10^{20}$ atoms/cm$^3$.

The stack of semiconductor layers may comprise an electron barrier layer formed of a ternary alloy, for example, aluminum gallium nitride (AlGaN) or aluminum indium nitride (AlInN) in contact with the active layer and the intermediate layer, to ensure a good distribution of electric carriers in the active layer.

Substrate 20 is at least partly made of at least one semiconductor material. The semiconductor material may be silicon, germanium, silicon carbide, a III-V compound, a II-VI compound, or a combination of at least two of these compounds. Preferably, substrate 20 is made of a semiconductor material compatible with the manufacturing methods implemented in microelectronics. Substrate 20 may be heavily doped, lightly-doped or non-doped. Preferably, substrate 20 is made of single-crystal silicon.

The height of walls 28, measured in a direction orthogonal to surface 24, is in the range from 1 µm to 200 µm, preferably from 5 µm to 30 µm. The thickness of walls 28, measured in a direction parallel to surface 24, is in the range from 100 nm to 50 µm, preferably from 1 µm to 10 µm. In the view of FIG. 2, the area of a subpixel Pix delimited by walls 54 corresponds to the area of a square having a side ranging from 0.1 µm to 100 µm, preferably from 1 µm to 30 µm.

Seed layer 38 is made of a material favoring the growth of wires 46. Seed layer 38 may correspond to a multilayer structure. As an example, the material forming seed layer 38 may be a nitride, a carbide, or a boride of a transition metal from column IV, V, or VI of the periodic table of elements or a combination of these compounds. As an example, seed layer 38 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum nitride and carbide (TaCN), of magnesium nitride in Mg$_x$N$_y$ form, where x is approximately equal to 3 and y is approximately equal to 2, for example, magnesium nitride according to form Mg$_3$N$_2$ or magnesium gallium nitride (MgGaN), of tungsten (W), of tungsten nitride (WN), or of a combination thereof. Seed layer 38 may be doped with the same conductivity type as substrate 20. The thickness of seed layer 38, measured in a direction orthogonal to surface 24, is in the range from 10 nm to 10 µm, preferably between 20 nm and 100 nm. Preferably seed layer 38 is linked to substrate 20 by an epitaxial relationship. Preferably wires 46 are linked to seed layer 38 by an epitaxial relationship. In an embodiment, seed layer 38 may not be present.

Pads 18, 58 are made of an electrically conductive material, for example a metal such as aluminum (Al), silver (Ag), copper (Cu), gold (Au), tin (Sn), nickel (Ni), palladium (Pd), zinc (Zn) or the alloys of any of the two and three of these metals such as gold-tin (AuSn), silver-tin (AgSn), copper-silver (CuAg), nickel-palladium (NiPd).

The openings 26 may be filled by photoluminescent block 34. In an embodiment, all openings 26 are filled with photoluminescent block 34. In another embodiment, some openings 26 are filled with photoluminescent blocks 34 and some openings 26 are not filled with photoluminescent blocks 34. In another embodiment, all openings 26 are not filled with photoluminescent blocks 34. Each photoluminescent block 34 comprises phosphors capable, when they are excited by the light emitted by light-emitting diode 16 of subpixel Pix, of emitting light at a wavelength different from the wavelength of the light emitted by light-emitting diode 16.

Each photoluminescent block 34 comprises particles of at least one photoluminescent material. An example of a photoluminescent material is yttrium aluminum garnet (YAG) activated by the trivalent cerium ion, also called YAG:Ce or YAG:Ce$^{3+}$. The average size of the particles of conventional photoluminescent materials is generally greater than 5 µm.

In an embodiment, each photoluminescent block 34 comprises a matrix having nanometer-range monocrystalline particles of a semiconductor material, also called semiconductor nanocrystals or nanophosphors particles hereafter, dispersed therein. The internal quantum efficiency $QY_{int}$ of a photoluminescent material is equal to the ratio of the number of emitted photons to the number of photons absorbed by the photoluminescent substance. Internal quantum efficiency $QY_{int}$ of the semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum boxes or quantum dots.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide (AgInS$_2$), and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

The matrix is made of an at least partly transparent material. The matrix is for example made of silica. The matrix is for example made of any at least partly transparent polymer, particularly of silicone, epoxy or of polyacetic acid (PLA). The matrix may be made of an at least partly transparent polymer used with three-dimensional printers, such as PLA. According to an embodiment, the matrix contains from 2% to 90%, preferably from 10% to 60%, by mass of nanocrystals, for example, approximately 20% by mass of nanocrystals.

The thickness of photoluminescent blocks 34 depends on the nanocrystal concentration and on the type of nanocrystals used. The height of photoluminescent blocks 34 is preferably inferior to the sum of the height of walls 28 and seed layer 38.

Insulating layer 42 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (particularly of general formula SiO$_x$N$_y$, for example, Si$_2$ON$_2$), of hafnium oxide (HfO$_2$), or of diamond. The thickness of insulating layer 42, measured in a direction orthogonal to surface 24, is in the range from 0.01 µm to 5 µm, preferably 0.05 µm to 0.5 µm. Insulating layer 42 may correspond to a monolayer structure or a multilayer structure of different dielectric materials of the previous list.

Conductive layer 32 is capable of biasing each wire 46 and of giving way to the electromagnetic radiation emitted by light-emitting diodes LED. Conductive layer 32 may be made of a transparent and conductive material such as graphene or a transparent conductive oxide (TCO), for example, indium tin oxide (ITO) or aluminum zinc oxide (AZO) or Gallium Zinc oxide (GZO). As an example, conductive layer 32 has a thickness in the range from 5 nm to 1000 nm, preferably from 20 nm to 100 nm.

Coatings 30 may correspond to reflective coatings, for example made of a metal such as aluminum, silver, copper, ruthenium or zinc. Coatings 30 may also correspond to waveguides, for example made of one or a multiple dielectric material(s). Coatings 30 may correspond to light-absorbing coatings (for example comprising a dark colour surface) to ensure good contrast as compared to the neighbouring sub-pixels when the sub-pixel is switched off. Each coating 30 may correspond to the combination of a reflective coating and a waveguide or a light-absorbing coating and a waveguide.

Walls 54 and via 56 are for example made of a metal such as aluminum, silver, copper, or zinc. Walls 54 may comprise a core covered by a reflective layer, for example made of a metal such as aluminum, silver, copper, or zinc. The core may be made of a dielectric material. In an embodiment, cores of walls 54 correspond to cavities that can be filled either with air or a partial vacuum. The height of walls 54 is preferably about the same as the height of wires 46. The thickness of walls 54, measured in a direction parallel to surface 24, is in the range from 100 nm to 50 µm, preferably from 500 nm to 10 µm. The minimal distance between walls 54 and shells 48 is the range from 1 µm to 50 µm, preferably from 3 µm to 10 µm.

Encapsulation layer 50 is made of one or a multiple dielectric material(s), for example like the materials disclosed for insulating layer 42. In an embodiment, encapsulation layer 50 comprises a multilayer structure surrounding each light-emitting diode 16. In an example, encapsulation layer 50 comprises, for each light-emitting diode 16, a first layer surrounding said light-emitting diode 16 and a second layer surrounding the first layer. First and second layers may be made of dielectric materials for example like the materials disclosed for insulating layer 42.

Figure 4:
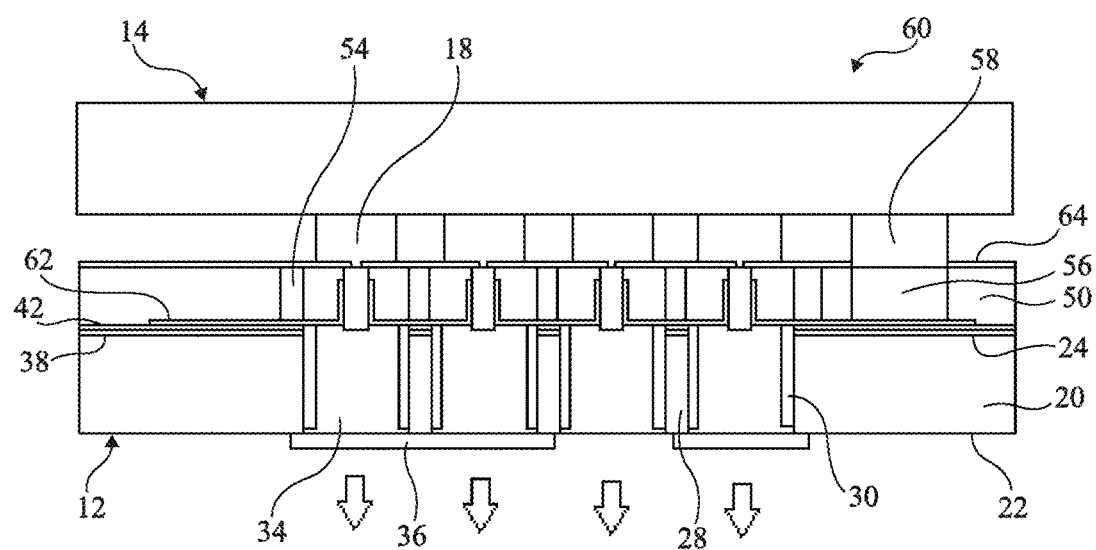
FIGS. 4 and 5 are views respectively analog to FIGS. 1 and 3 of another embodiment of an optoelectronic device.
Figure 5:
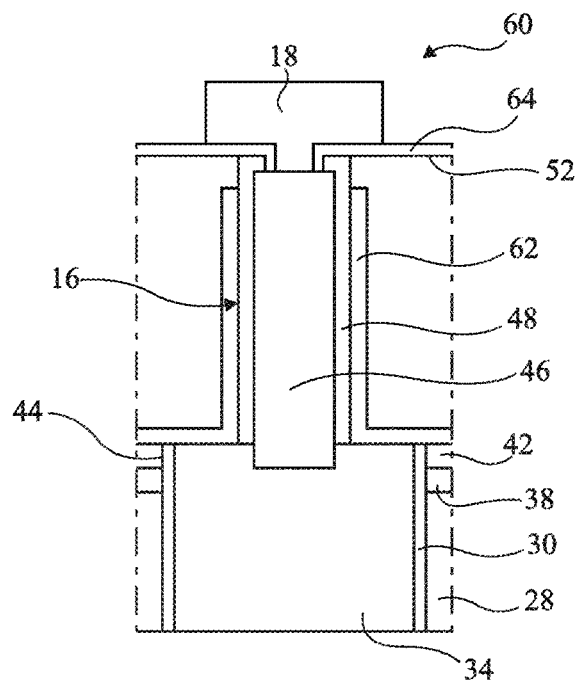

FIGS. 4 and 5 are partial simplified cross-section views analog respectively to FIGS. 1 and 3 of another embodiment of an optoelectronic device 60 comprising light-emitting diodes. Optoelectronic device 60 comprises the same elements as optoelectronic device 10 shown in FIGS. 1 to 3 with the difference that conductive layer 32 is not present, that it comprises an electrically conductive layer 62 covering a part of each shell 48 and being in contact with walls 54 and with via 56 and that pads 18 are in electrical contact with wires 46 and are insulated from shells 48 by an electrically insulating layer 64.

Electrically conductive layer 62 may be in the same material as layer 32. The thickness of conductive layer 62 is in the range from 5 nm to 1000 nm, preferentially 20 to 200 nm.

Insulating layer 64 may be in the same material as insulating layer 50. The thickness of insulating layer 64 is in the range from 10 nm to 1000 nm, preferentially 50 nm to 300 nm.

FIGS. 6A to 6F are partial simplified cross-section views of the structures obtained at successive steps of an embodiment of a method of manufacturing optoelectronic device 10 shown in FIGS. 1 to 3.

Figure 6A:
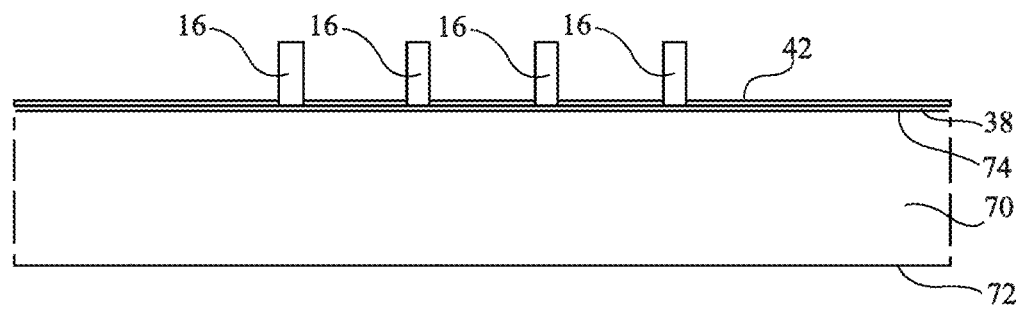
FIGS. 6A to 6F are partial simplified cross-section views of the structures obtained at successive steps of an embodiment of a method of manufacturing the optoelectronic device shown in FIGS. 1 and 2.

FIG. 6A shows the structure obtained after the steps of:
 providing a one-piece substrate 70 having two opposite faces 72, 74;
 forming seed layer 38 on face 74 of substrate 70;
 forming insulating layer 42 on seed layer 38;
 forming openings 44 in insulating layer 42; and
 forming light-emitting diodes 16 on seed layer 38, that is forming wires 46 on seed layer 38 and forming shells 48, not shown in FIG. 6A, on wires 46.

Substrate 70 is made of the same material as substrate 20. Seed layer 38 may be obtained by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as an atomic layer deposition (ALD). Further, methods such as evaporation or reactive cathode sputtering may be used.

Wires 46 and shells 48 may be grown by a process of CVD, MOCVD, MBE, GSMBE, PAMBE, ALE, HVPE, ALD type. An example of a method for manufacturing wires 46 and shells is disclosed in patent application US2015/0280053. For each light-emitting diode 16, shell 48 may cover the lateral faces and the top face of wire 46. In another embodiment, shell 48 may be present only on top face of wire 46 opposite to substrate 70.

Figure 6B:
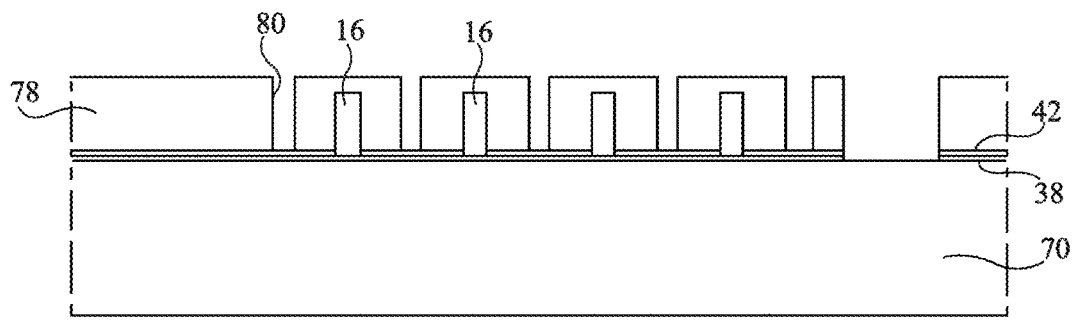

FIG. 6B shows the structure obtained after the steps of:
 etching insulating layer 42 and seed layer 38 at least at the location where via 56 is to be formed;
 forming an encapsulation layer 78 on insulating layer 42 and on the wire 16, the height of encapsulation layer 78 being higher than the height of light-emitting diode 16; and
 forming openings or trenches 80 through encapsulation layer 50 at the locations where walls 54 and via 56 are to be formed. The dimensions of openings 80 correspond to the desired dimensions of walls 54 and via 56. The etching is stopped on insulating layer 42 or seed layer 38 for openings 80 made for walls 54. The etching is stopped on substrate 70 for opening 80 made for via 56. The implemented etching may be a dry etching, in particular when vertical slopes are required for walls 54, for example via a chloride or fluoride based plasma or a reactive ion etching (RIE).

Figure 6C:
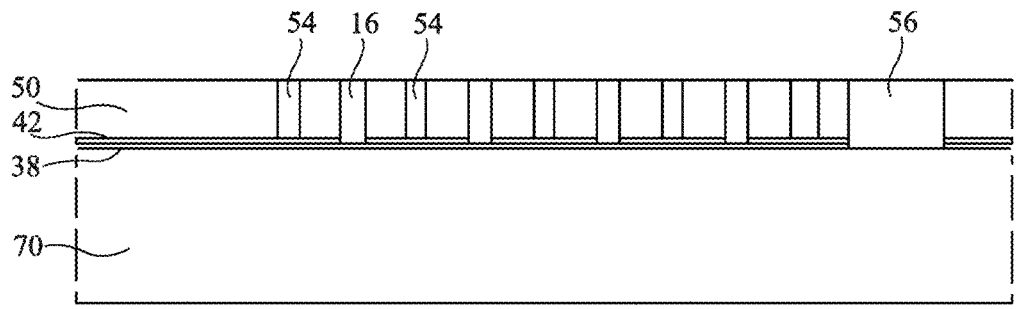

FIG. 6C shows the structure obtained after the steps of:
 forming a conductive layer on encapsulation layer 50, conductive layer filing openings 80;
 etching conductive layer and encapsulation layer 78 up to the tops of shells 48 of light-emitting diodes 16, resulting in the formation of encapsulation layer 50, walls 54 and via 56.

Figure 6D:
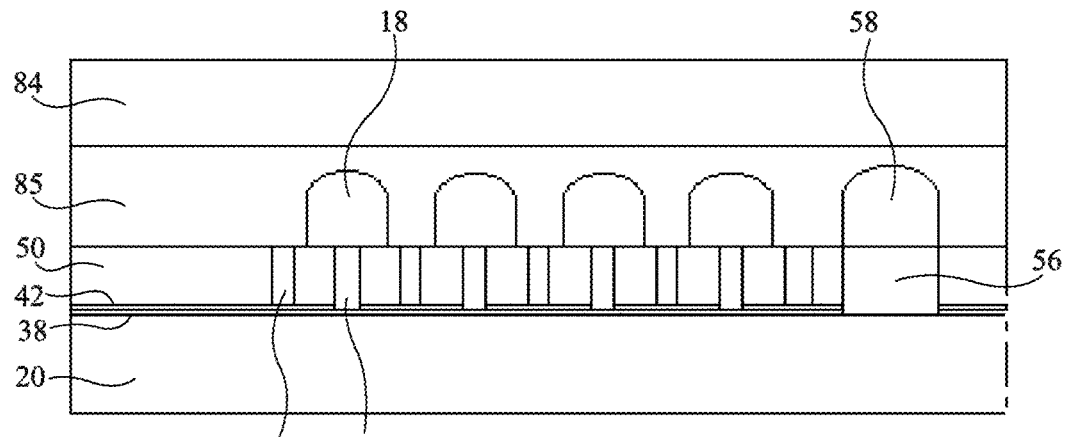

FIG. 6D shows the structure obtained after the steps of:
 forming pads 18, 58 on encapsulation layer 50 and in contact with shells 48 of light-emitting diodes 16, pads 18 being in contact with shells 48 of light-emitting diodes 16 and pad 58 being in contact with via 56;
 binding a support 84, also called holder, to encapsulation layer 50, by using a biding material 85; and
 thinning substrate 70 from the side opposite to support 84 to form substrate 20.

Pads 18 and 58 may be preferentially formed by electrochemical deposition of an electrically conductive layer on encapsulation layer 50, the conductive layer being made of the material of contact pads 18 and 58, and by etching the conductive layer to delimit contact pads 18 and 58. The implemented etching may be a dry etching, for example via a chloride or fluoride based plasma, a reactive ion etching (RIE), or wet etching (for example with hydrofluoric acid, HF).

Figure 6E:
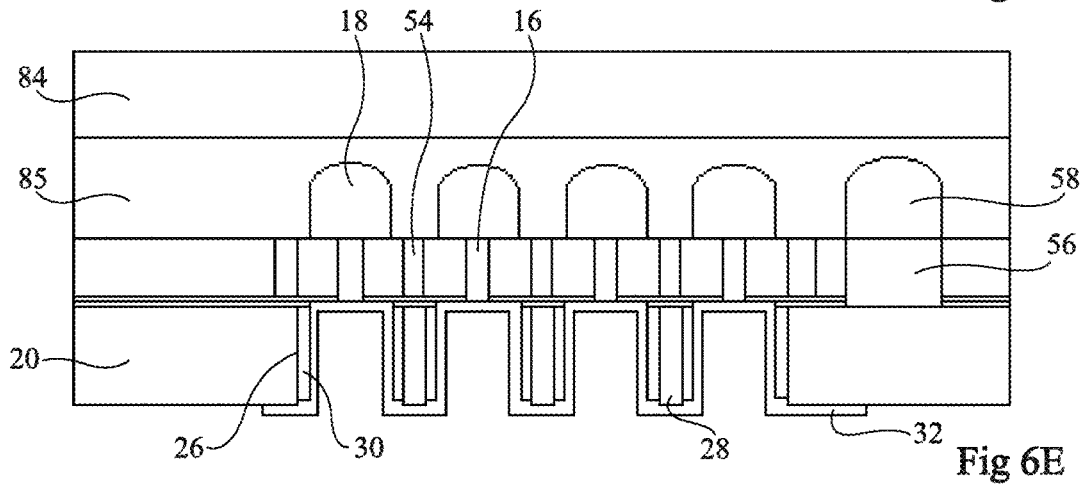

FIG. 6E shows the structure obtained after the steps of:
 etching openings 26 in substrate 20 and in seed layer 38 up to insulating layer 42 to expose the base of each wire 46;
 forming reflective coating 30 on the lateral faces of each opening 26; and
 forming conductive layer 32.

The dimensions of openings 26 correspond to the desired dimensions of photoluminescent blocks 34. This etching is stopped on insulating layer 42. The implemented etching may be a dry etching, for example via a chloride or fluoride based plasma, a reactive ion etching (RIE) or wet etching preferentially an anistropic wet etching such as potassium hydroxide (KOH) for Si <100> and <111>.

Figure 6F:
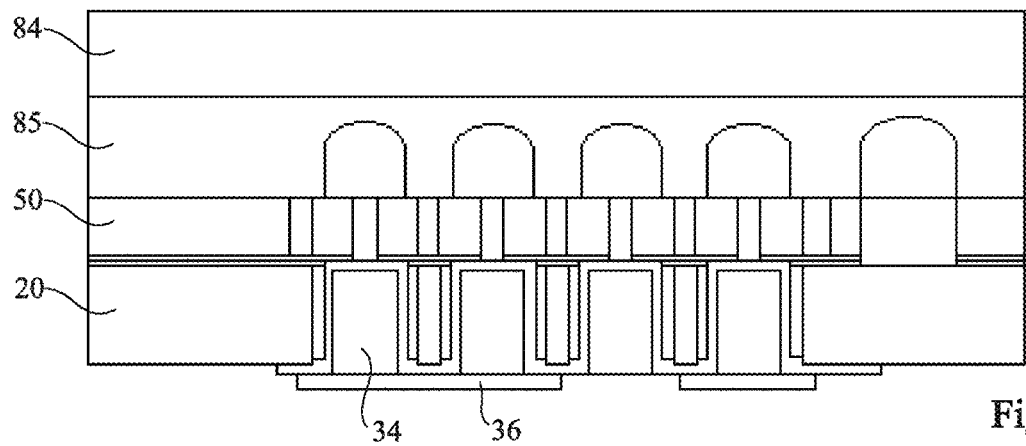

FIG. 6F shows the structure obtained after the steps of:
 forming photoluminescent blocks 34 inside openings 26;
 etching the parts of photoluminescent blocks 34 outside openings 26; and
 forming filters 36.

Photoluminescent blocks 34 may be formed by filling certain openings 26 with a colloidal dispersion of the semiconductor nanocrystals in a binding matrix, for example, by a so-called additive process, possibly by obstructing certain openings 26 with resin. The so-called additive process may comprise direct printing of the colloidal dispersion at the desired locations, for example, by inkjet printing, aerosol printing, microstamping, photogravure, silk-screening, flexography, spray coating, or drop casting.

By withdrawing holder 84 and binding material 85, optoelectronic chip 12 shown in FIG. 1 is obtained.

In the present embodiment, the bonding of the control chip 14 to optoelectronic chip 12 may be performed with use of inserts such as connection microbonding pads, microbumps or microbeads 18. Alternatively, the bonding of control chip 14 to optoelectronic chip 12 may be performed by direct bonding, with no use of inserts. The direct bonding may comprise a direct metal-to-metal bonding of metal areas of optoelectronic chip 12 and of metal areas of control chip 14 and a dielectric-to-dielectric bonding of the dielectric areas at the surface of optoelectronic chip 12 and of the dielectric areas at the surface of control chip 14. The bonding of control chip 14 to optoelectronic chip 12 may be performed by a thermocompression method where optoelectronic chip 12 is placed against control chip 14, with a pressure and a heating being applied.

FIGS. 7A to 7F are partial simplified cross-section views of the structures obtained at successive steps of an embodiment of a method of manufacturing optoelectronic device 60 shown in FIG. 4.

Figure 7A:
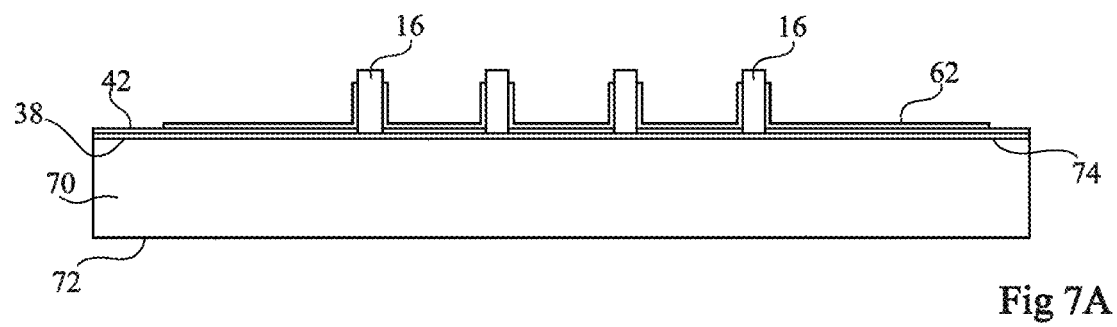
FIGS. 7A to 7F are partial simplified cross-section views of the structures obtained at successive steps of an embodiment of a method of manufacturing the optoelectronic device shown in FIG. 4.

FIG. 7A shows the structure obtained after the steps previously disclosed in relation to FIG. 6A and after the step of forming conductive layer 62 covering insulating layer 42 and covering shells 48 of light-emitting diodes 16 except for the top parts of shells 48. In another embodiment, at this step, conductive layer 62 covers completely shells 48.

Figure 7B:
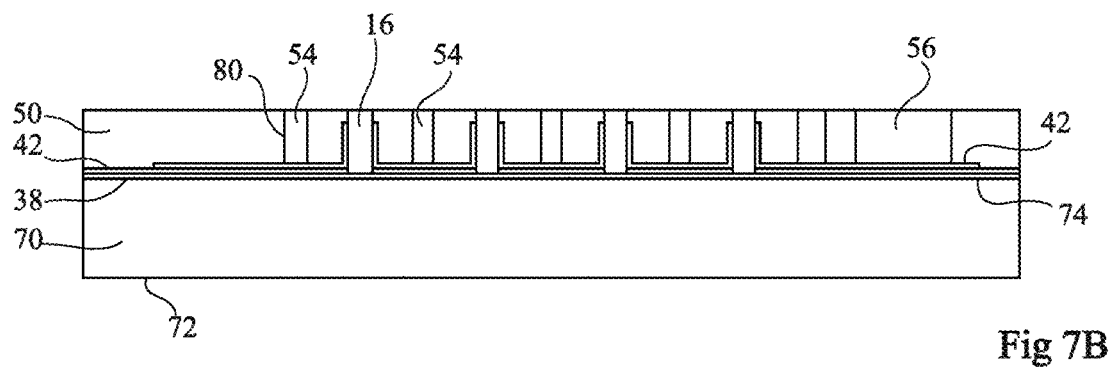

FIG. 7B shows the structure obtained after the steps previously disclosed in relation to FIGS. 6B and 6C with the difference that encapsulation layer 50 is formed on conductive layer 62 and that conductive layer 62 is not etched at the location of via 56. Encapsulation layer 50 is filled between wires 46 and/or walls 54 and via 56

Figure 7C:
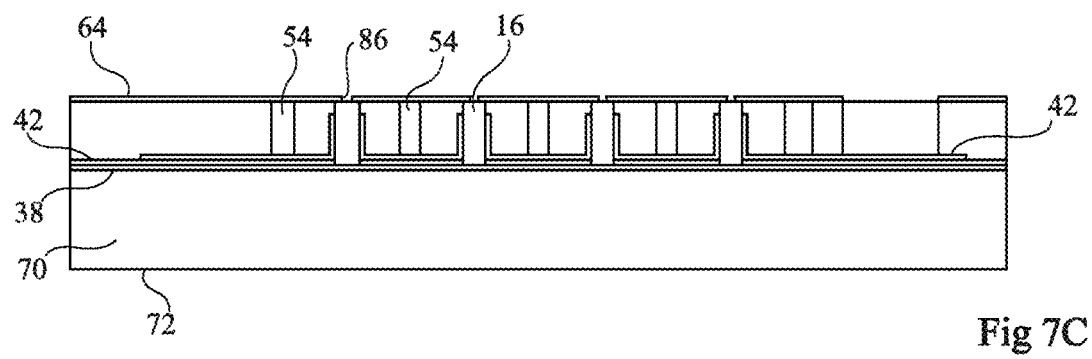

FIG. 7C shows the structure obtained after the steps of:
etching tops of shells 48 to expose the ends of wires 46;
forming electrically insulating layer 64 covering encapsulation layer 50; and
etching openings 86 in insulating layer 64 to expose the ends of wires 46 and to expose via 56.

The lateral dimension of an opening 86 is inferior to the lateral dimension of the wire 46. In an example, when the lateral dimension of the wire 46 is about 0.5 µm, the lateral dimension of an opening 86 may be about 0.3 µm.

Figure 7D:
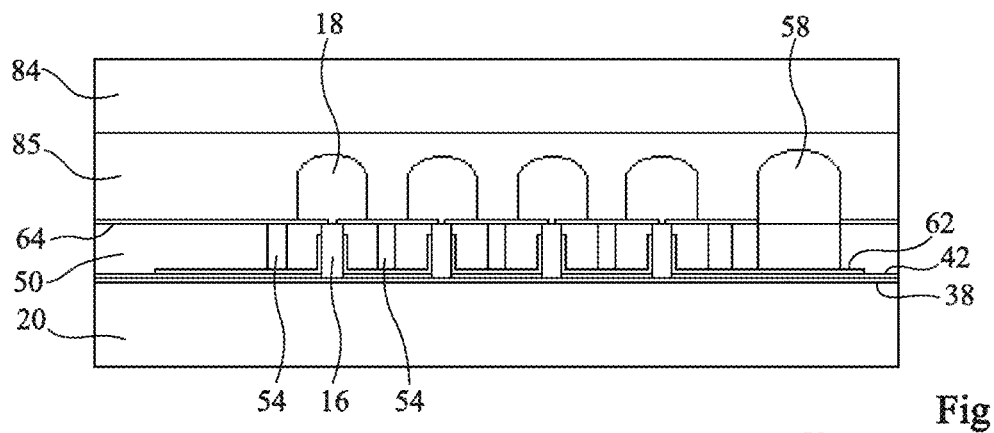

FIG. 7D shows the structure obtained after the steps previously disclosed in relation to FIG. 6D, pads 18 being in contact with the ends of wires 46.

Figure 7E:
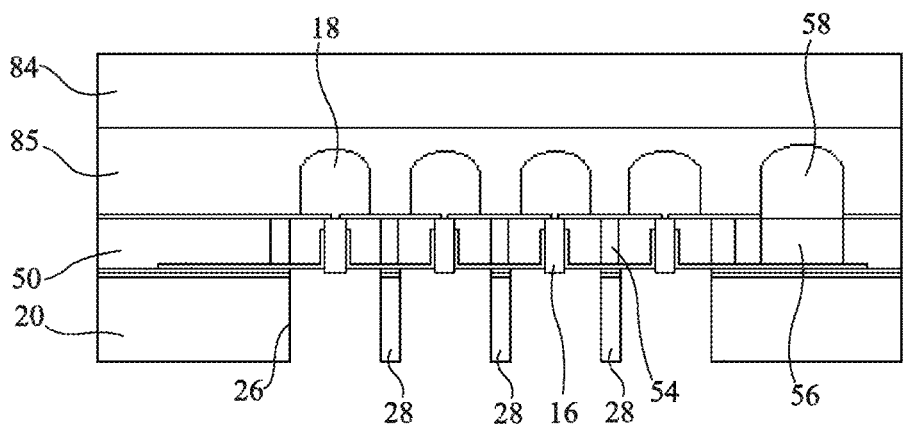

FIG. 7E shows the structure obtained after the steps of:
etching openings 26 in substrate 20, seed layer 38 and insulating layer 42 to expose conductive layer 62 and wires 46 and shells 48.

Figure 7F:
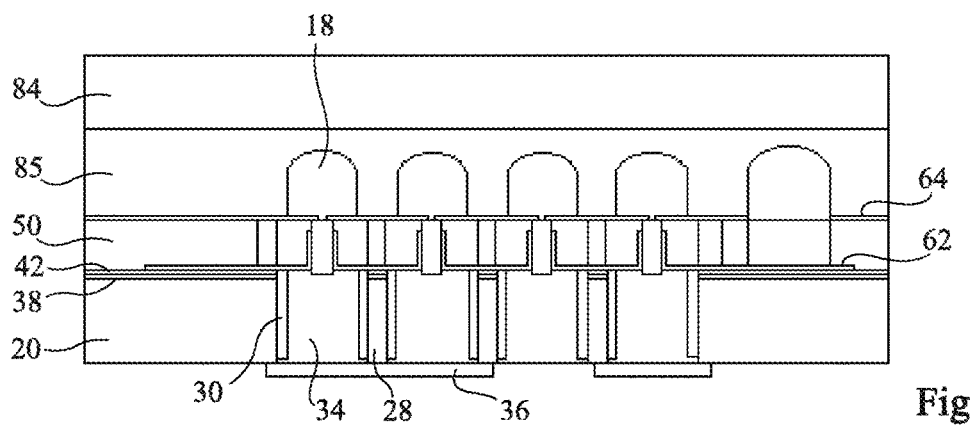

FIG. 7F shows the structure obtained after the step of:
forming reflective coating 30 on the lateral faces of each opening 26; and
the steps previously disclosed in relation to FIG. 6F.

After withdrawing holder 84, optoelectronic chip 12 shown in FIG. 4 is obtained.

FIGS. 8 to 12 show various alterations of optoelectronic device 60 shown in FIG. 4. In these figures, control chip 14 is not shown.

Figure 8:
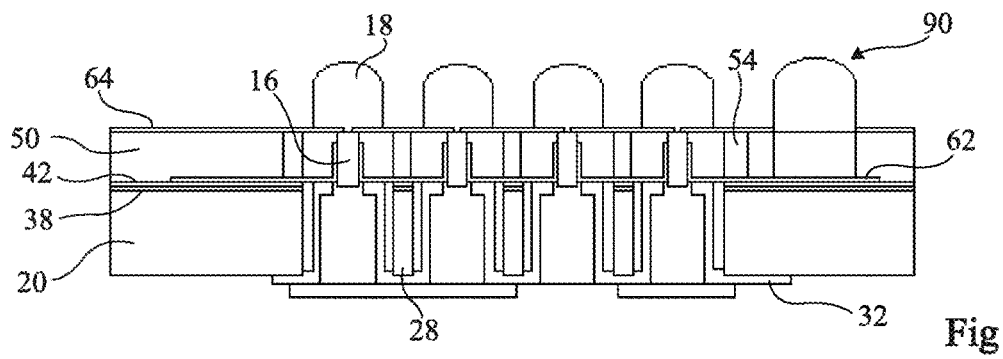
FIGS. 8 to 12 are partial simplified cross-section views of other embodiments of optoelectronic devices.

FIG. 8 is a partial simplified cross-section view analog to FIG. 4 of another embodiment of an optoelectronic device 90 comprising light-emitting diodes. Optoelectronic device 90 comprises the same elements as optoelectronic device 60 shown in FIG. 4, and also comprises conductive layer 32 shown in FIG. 1, conductive layer 32 being in contact with conductive layer 62. However, conductive layer 32 is etched around each light-emitting diodes 16 in order to prevent conductive layer 32 from being in contact with wires 46. An increased electrical and thermal conductivity is obtained.

Figure 9:
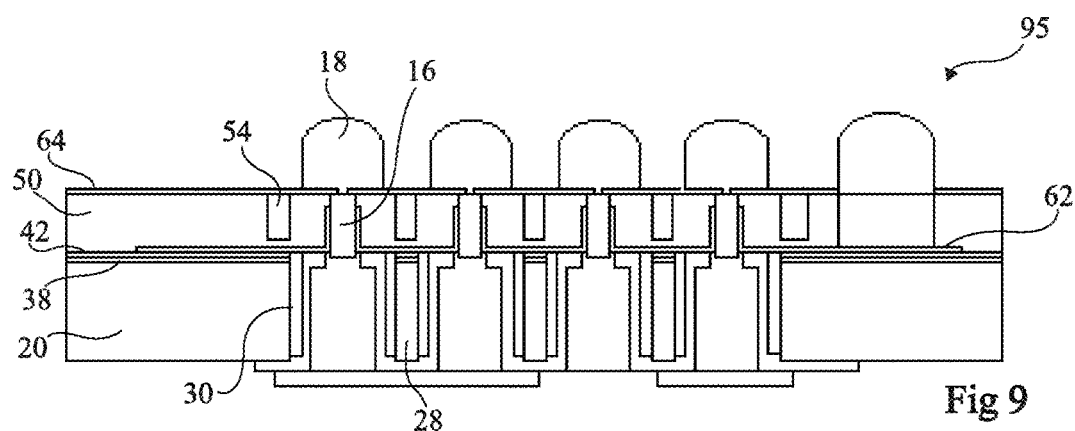

FIG. 9 is a partial simplified cross-section view analog to FIG. 8 of another embodiment of an optoelectronic device 95 comprising light-emitting diodes. Optoelectronic device 95 comprises the same elements as optoelectronic device 90 shown in FIG. 8 with the difference that walls 54 are not in contact with conductive layer 62. The method of manufacturing optoelectronic device 95 may be simpler than the method of manufacturing optoelectronic device 90 since, at the step shown in FIG. 7B where openings 80 are etched, the etching method does not need to be chosen to stop on conductive layer 62.

Figure 10:
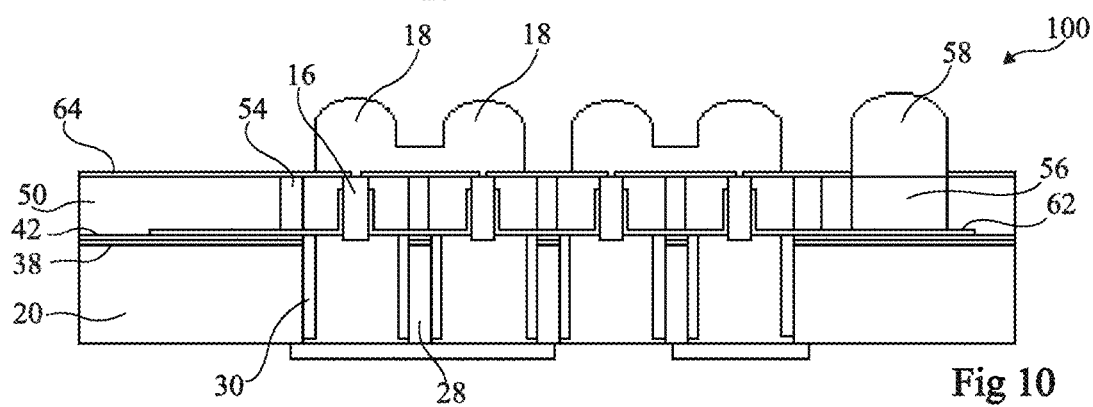

FIG. 10 is a partial simplified cross-section view analog to FIG. 8 of another embodiment of an optoelectronic device 100 comprising light-emitting diodes. Optoelectronic device 100 comprises the same elements as optoelectronic device 90 shown in FIG. 8 with the difference that some pads 18 are connected together. Preferably, the pads 18 connected together are associated with adjacent subpixels emitting the same color. Therefore, for two light-emitting diodes or wires 16 associated with connected pads 18, if one of the light-emitting diodes is not working, there may be still emission of light by the other light-emitting diodes, which avoids a completely dark subpixel to be obtained. Moreover, for two light-emitting diodes or wires 16 associated with connected pads 18, if one of pad 18 is not connected properly to control circuit 14, there is still a connection between control circuit 14 and optoelectronic circuit 12 through the other pad 18.

Figure 11:
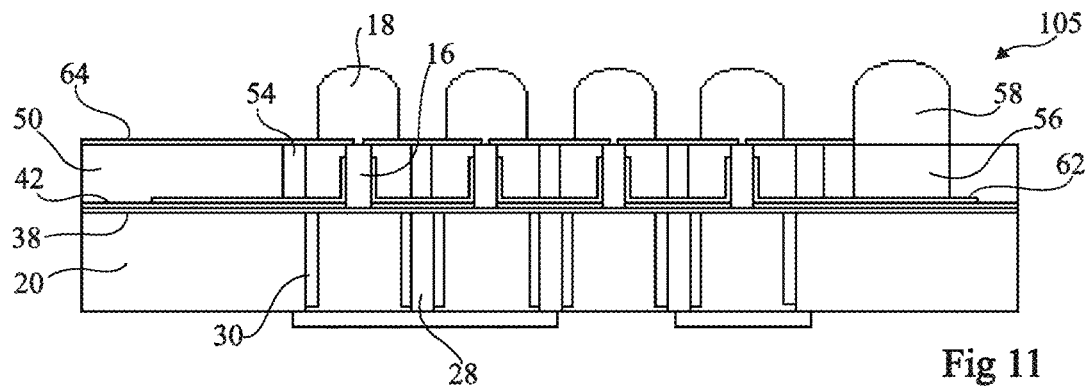

FIG. 11 is a partial simplified cross-section view analog to FIG. 8 of another embodiment of an optoelectronic device 105 comprising light-emitting diodes. Optoelectronic device 105 comprises the same elements as optoelectronic device 90 shown in FIG. 8 with the difference that seed layer 38 is not etched in openings 26. The method of manufacturing optoelectronic device 105 may be simpler than the method of manufacturing optoelectronic device 90 since there is not etching of seed layer 38.

Figure 12:
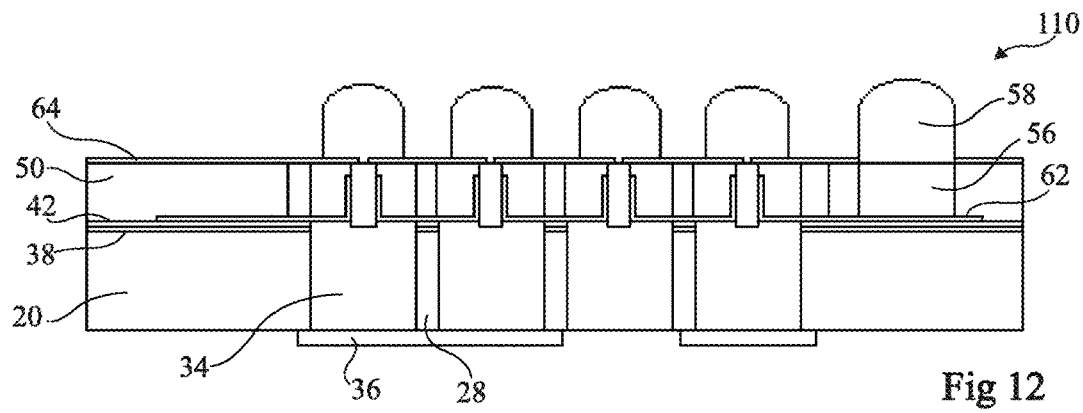

FIG. 12 is a partial simplified cross-section view analog to FIG. 8 of another embodiment of an optoelectronic device 110 comprising light-emitting diodes. Optoelectronic device 110 comprises the same elements as optoelectronic device 90 shown in FIG. 8 with the difference that reflective coatings 30 are not present. The method of manufacturing optoelectronic device 110 may be simpler than the method of manufacturing optoelectronic device 90.

Figure 13:
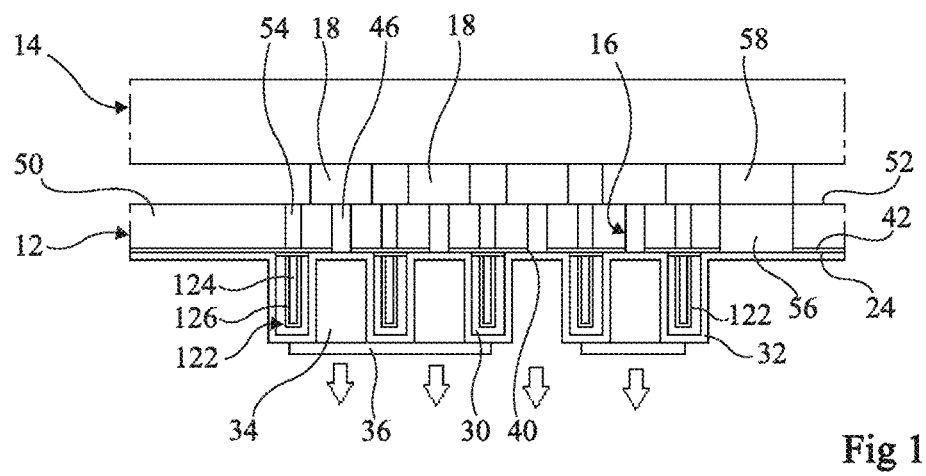
FIG. 13 is a partial simplified cross-section view of an embodiment of an optoelectronic device.

FIG. 13 is a partial simplified cross-section view analog to FIG. 1 of another embodiment of an optoelectronic device 120 comprising light-emitting diodes. Optoelectronic device 120 comprises the same elements as optoelectronic device 10 shown in FIG. 1 with the difference that semiconductor substrate 20 is not present and that walls 28 are replaced by walls 122 resting on the surface 24, each wall 122 comprising a core 124 of a filler material covered with an electrically insulating layer 126. As a variation, for each wall 122, insulating layer 126 may not be present. In FIG. 13, coatings 30 cover both the lateral faces and the ends of walls 122. Conductive layer 32 covers the walls 122, the bottom of each opening 26 and the remainder of surface 24. In particular, conductive layer 32 is in mechanical contact with via 56. Moreover, seed layer 38 may be present only between walls 122 and insulating layer 42.

The dimensions of walls 122 may be the same as the dimensions of walls 28. Core 124 may be made of a semiconductor material, for example silicon, in particular polycrystalline silicon, or of an electrically insulating material, for example $SiO_2$. Insulating layer 126 may be made of a dielectric material, for example, of silicon oxide ($SiO_2$), of silicon nitride ($Si_xN_y$, where x is approximately equal to 3 and y is approximately equal to 4, for example, $Si_3N_4$), or of silicon oxynitride (particularly of general formula $SiO_xN_y$, for example, $Si_2ON_2$), of hafnium oxide ($HfO_2$), of aluminum oxide ($Al_2O_3$) or of titanium oxide ($TiO_2$). Insulating layer 126 is for example made of thermal silicon oxide or an oxide deposited by ALD. The thickness of insulating layer 126 may be in the range from 10 nm to 1000 nm.

FIGS. 14A to 14H are partial simplified cross-section views of the structures obtained at successive steps of an embodiment of a method of manufacturing optoelectronic device 120 shown in FIG. 13.

Figure 14A:
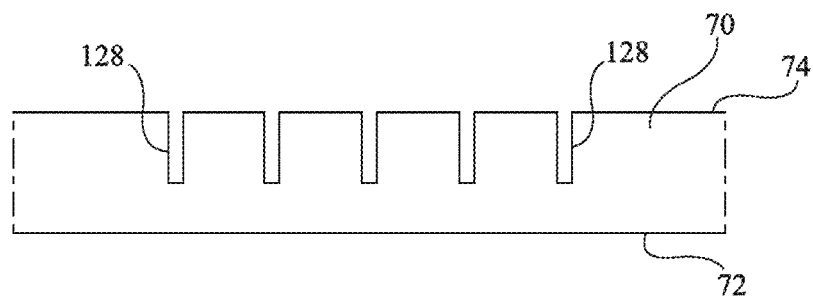
FIGS. 14A to 14H are partial simplified cross-section views of the structures obtained at successive steps of an embodiment of a method of manufacturing the optoelectronic device shown in FIG. 13.

FIG. 14A shows the structure obtained after the formation in substrate 70 of openings 128 from face 74 at the desired locations of walls 122. Openings 128 can be obtained by etching substrate 70, for example by dry etching.

Figure 14B:
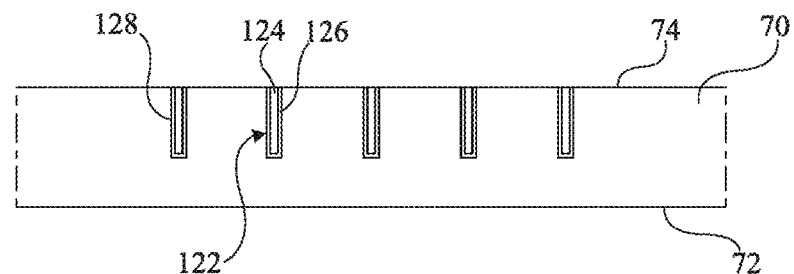

FIG. 14B shows the structure obtained after the formation, in each opening 128, of insulating layer 126 and insulating core 124. According to one embodiment, a layer of the material composing insulating layers 126 may be deposited in openings 128 and on the rest of face 74 of substrate 70 and a layer of the material composing cores 124 may be deposited on the entire structure, in particular to fill openings 128. The layer of the material composing insulating layers 126 and the layer of the material composing cores 124 are the removed, for example by etching, outside openings 128. Walls 122 are thus obtained. An advantage is that walls 122 having a high aspect ratio (ratio of the height and width of the walls) can be obtained with a reduced width. The outer layer of walls 122 in contact with substrate 70 is of a material that allows the implementation of a selective etching of substrate 70 with respect to walls 122 that is implemented at a later stage of the process. Thus, when substrate 70 is made of silicon, insulating layers 126 of walls 122 may be made of $SiO_2$. When substrate 70 is made of GaN or GaAs, layer 126 may not be present and walls 122 may be entirely made of silicon.

Figure 14C:
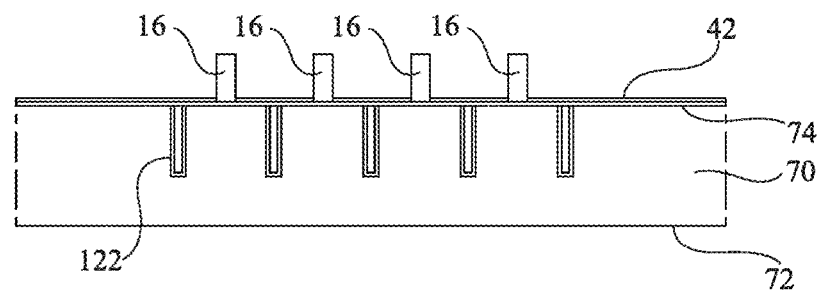

FIG. 14C shows the structure obtained after the same steps as those previously described in relation to FIG. 6A.

Figure 14D:
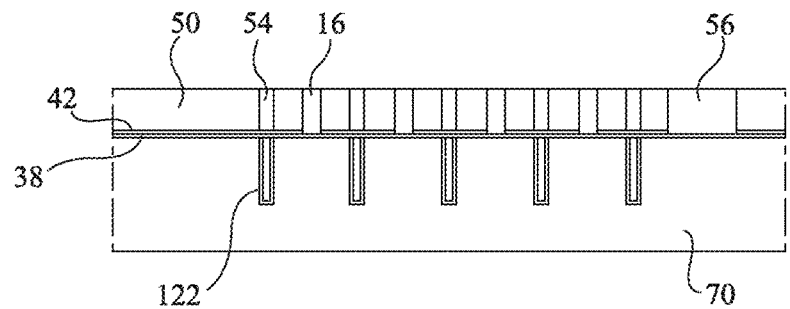

FIG. 14D shows the structure obtained after the same steps as previously described in relation to FIGS. 6B and 6C.

Figure 14E:
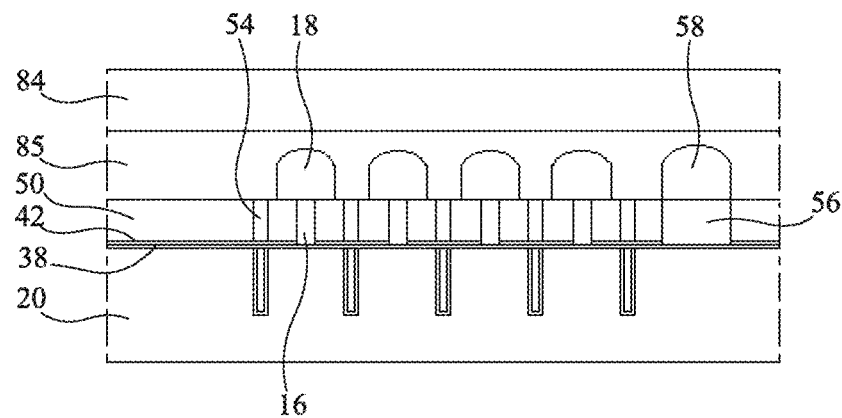

FIG. 14E shows the structure obtained after the same steps as those previously described in relation to FIG. 6D.

Figure 14F:
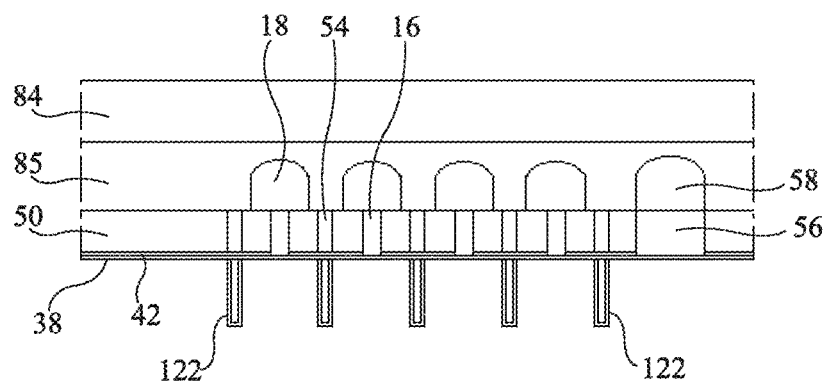

FIG. 14F shows the structure obtained after the withdrawal of substrate 70 to expose walls 122. The withdrawal of substrate 70 may be carried out in at least two steps, for example a first step of thinning substrate 70 from face 72, for example by mechanical polishing, this step being stopped before reaching insulating layers 126 and a second etching step, for example a chemical etching, to remove the rest of substrate 70. An advantage is that insulating layers 126 can act as a stop layer during etching of substrate 70.

Figure 14G:
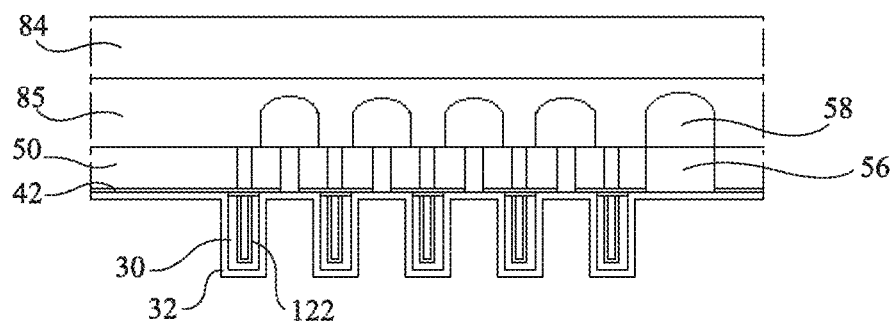

FIG. 14G shows the structure obtained after the withdrawal of seed layer 38, after the formation of coatings 30 on walls 122 and after the formation of conductive layer 32 on the whole of the structure on the side of walls 122. Coatings 30 may be formed by evaporation, sputtering or ALD and conductive layer 32 may be formed by conformal deposition, for example by evaporation or sputtering.

Figure 14H:
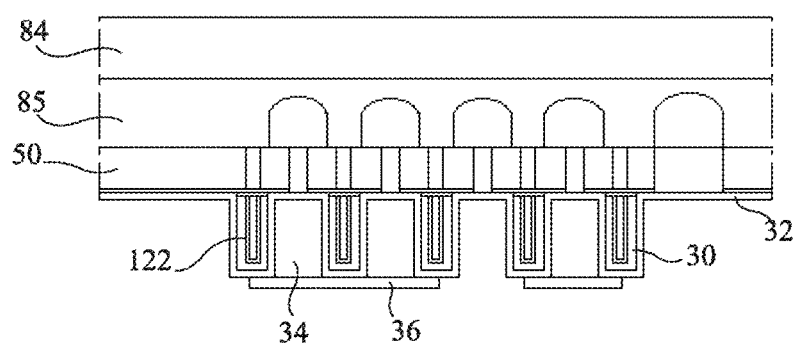

FIG. 14H shows the structure obtained after the same steps as those previously described in relation to FIG. 6F.

Specific embodiments have been described. Various alterations and modifications will occur to those skilled in the art. In particular, although in the previously-described embodiments, optoelectronic chip 12 is directly bonded to control chip 14, optoelectronic chip 12 and control chip 14 may be each bonded to a printed circuit. Moreover, although in the previously-described embodiments, the walls 28 and 54 have lateral faces that are substantially orthogonal to surface 24, lateral faces of walls 28 and 54 may be profiled, for example inclined with respect to surface 24.

Moreover, although in the previously-described embodiments substrate 70 is a one-piece substrate, substrate 70 may correspond to a multilayer structure, for example a SOI structure comprising an insulating layer covering a semiconductor base and a semiconductor layer covering the insulating layer. At the step previously-described in relation to FIG. 6D or 7D in which substrate 70 is thinned down, the semiconductor base and the insulating layer covering the semiconductor base may be withdrawn to leave the semiconductor layer which corresponds to substrate 20.

Moreover, several embodiments with various alterations have been described. Some elements of these embodiments and alterations can be combined. As an example, the alterations applied to optoelectronic device 60 and shown in FIGS. 9 to 12 may be applied to optoelectronic device 10 shown in FIG. 1.

The invention claimed is:

1. A method of manufacturing an optoelectronic device, comprising the successive steps of:
    a) providing a substrate at least partially made of a semiconductor material and having first and second opposite faces;
    b) forming light-emitting diodes on the substrate, each light-emitting diode comprising a semiconductor microwire or nanowire covered by a shell;
    c) forming an encapsulation layer surrounding the light-emitting diodes;
    d) forming conductive pads on the encapsulation layer, on the side of the encapsulation layer opposite to the substrate, in contact with the light-emitting diodes; and
    e) forming through openings in the substrate from the side of the second face, said openings being opposite at least part of the light-emitting diodes and delimiting walls in the substrate.

2. The method of claim 1, further comprising the step of:
    f) forming photoluminescent blocks in at least some of the openings.

3. The method of claim 1, wherein step b) comprises forming a seed layer in contact with the substrate, the seed layer being made of a material favoring the growth of the semiconductor microwire or nanowire, and growing the wires on the seed layer.

4. The method of claim 3, wherein the seed layer may be at least partially made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum nitride and carbide (TaCN), of magnesium nitride in MgxNy form, where x is equal to 3 to within 10% and y is equal to 2 to within 10%, of magnesium gallium nitride (MgGaN), of tungsten (W), of tungsten nitride (WN), or of a combination thereof.

5. The method of claim 1, further comprising, before step e), the step of thinning down the substrate.

6. The method of claim 1, further comprising, before step e), the step of bonding the encapsulation layer to an electronic circuit or a holder.

7. The method of claim 1, further comprising, before step d), the step of etching trenches in the encapsulation layer between the light-emitting diodes and covering each trench with a reflective coating, at least partially filling each trench with a filling material and/or letting air or a partial void in each trench.

8. The method of claim 1, wherein, at step d), the conductive pads are formed in contact with the shells.

9. The method of claim 1, further comprising, before step d), the step of etching portions of the shells to expose the ends of the semiconductor microwires or nanowires, the conductive pads, at step d) being formed in contact with the semiconductor microwires or nanowires and being electrically insulated from the shells.

10. The method of claim 1, wherein each semiconductor microwire or nanowire comprises lateral faces and a top face opposite to substrate and wherein, for each light-emitting diode, the shell covers the lateral faces and the top face of the microwire or nanowire.

11. The method of claim 1, wherein each semiconductor microwire or nanowire comprises lateral faces and a top face opposite to substrate and wherein, for each light-emitting diode, the shell covers only the top face of the microwire or nanowire.

12. The method of claim 1, comprising, before step b), forming openings in the substrate from the first face and forming the walls in said openings, the walls being at least made in part of a material different from the substrate, the method further comprising, in step e), removing the substrate to expose the walls.

13. An optoelectronic device comprising:
light-emitting diodes, each light-emitting diode comprising a semiconductor microwire or nanowire covered by a shell, the light-emitting diodes being surrounded by an encapsulation layer;
walls at least partially made of a semiconductor or electrically insulating material resting on the encapsulation layer, said walls delimiting openings, said openings being opposite at least part of the light-emitting diodes; and
conductive pads, on the side of the encapsulation layer opposite to the walls, in contact with the light-emitting diodes.

14. The optoelectronic device of claim 13, further comprising photoluminescent blocks in at least some of the openings.

15. The optoelectronic device of claim 13, further comprising, between the walls and the encapsulation layer, a seed layer in contact with the walls, the seed layer being made of a material favoring the growth of the semiconductor microwires or nanowires.

16. The optoelectronic device of claim 15, wherein the seed layer may be at least partially made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum nitride and carbide (TaCN), of magnesium nitride in MgxNy form, where x is equal to 3 to within 10% and y is equal to 2 to within 10%, of magnesium gallium nitride (MgGaN), of tungsten (W), of tungsten nitride (WN), or of a combination thereof.

17. The optoelectronic device of claim 13, further comprising trenches extending in the encapsulation layer, each trench being at least covered with a reflective coating.

18. The optoelectronic device of claim 13, wherein the conductive pads are in contact with the shells.

19. The optoelectronic device of claim 13, wherein the conductive pads are in contact with the semiconductor microwire or nanowire and being electrically insulated from the shells.

20. The optoelectronic device of claim 13, wherein each wall comprises a core of a semiconductor material covered with an electrically insulating layer.

* * * * *